United States Patent
Korobov et al.

(10) Patent No.: US 6,340,620 B1
(45) Date of Patent: Jan. 22, 2002

(54) METHOD OF FABRICATING A CAPACITOR

(75) Inventors: Vladimir Korobov, Kfar Saba; Miriam Grossman, Afula; Sylvie Rockman, Nesher, all of (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 09/386,349

(22) Filed: Aug. 31, 1999

(51) Int. Cl.[7] ............... H01L 21/20; H01L 21/8242
(52) U.S. Cl. ............... 438/396; 438/393; 438/210; 438/253; 438/239; 438/250; 438/381; 438/396; 438/488; 438/648; 438/655; 438/657; 438/682; 438/683; 438/684; 438/685; 438/664; 257/303; 257/304
(58) Field of Search ............... 438/393, 381, 438/488, 648, 657, 682, 683, 684, 685, 210, 396, 253, 655, 239, 250, 664; 257/303, 304

(56) References Cited

U.S. PATENT DOCUMENTS

| | | | | |
|---|---|---|---|---|
| 4,935,380 A | * | 6/1990 | Okumura | 437/44 |
| 5,208,180 A | * | 5/1993 | Gonzalez | 437/60 |
| 5,338,701 A | * | 8/1994 | Hsu et al. | 437/60 |
| 5,393,691 A | * | 2/1995 | Hsu et al. | 437/60 |
| 5,510,637 A | * | 4/1996 | Hsu et al. | 257/304 |
| 5,789,289 A | * | 8/1998 | Jeng | 438/253 |
| 5,804,488 A | * | 9/1998 | Shih et al. | 438/396 |
| 5,953,599 A | * | 9/1999 | El-Diway | 438/199 |
| 6,232,172 B1 | * | 5/2001 | Chen et al. | 438/251 |

* cited by examiner

*Primary Examiner*—Matthew Smith
*Assistant Examiner*—Belur V Keshaven
(74) *Attorney, Agent, or Firm*—Mark M. Friedman

(57) ABSTRACT

A process for fabricating a capacitor in a microcircuit, and the capacitor so fabricated. A first layer of a polycrystalline semiconductor, preferably polysilicon, is deposited. A layer of a binary metallic conductor, preferably tungsten silicide, is deposited on the first layer of polycrystalline semiconductor, and is annealed in an oxidizing atmosphere to produce an oxide layer that serves as the dielectric of the capacitor. A second layer of a polycrystalline semiconductor, also preferably polysilicon, is deposited on the oxide layer. The physical properties (index of refraction, charge to breakdown, breakdown voltage) of the dielectric so created are superior to those of the prior art dielectrics.

14 Claims, 1 Drawing Sheet

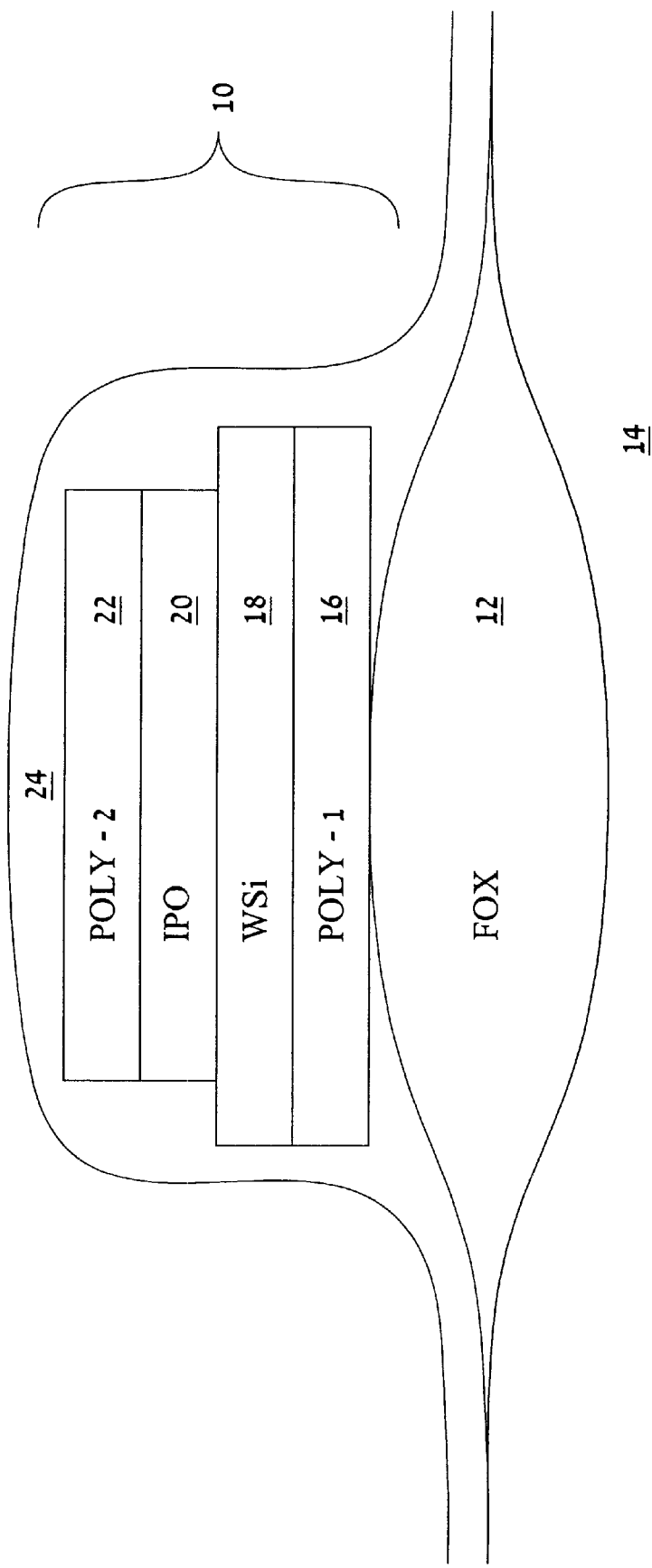

METHOD OF FABRICATING A CAPACITOR

FIELD AND BACKGROUND OF THE INVENTION

The present invention relates to microcircuitry and, more particularly, to a method for fabricating a capacitor in an integrated circuit.

Integrated circuits include a variety of components. Capacitors, in particular, are common components of analog circuits, such as are found in devices such as A/D converters. The sole Figure is a schematic cross-section of one such capacitor 10, resting on a field oxide (FOX) base 12 that in turn rests on a silicon wafer 14. Capacitor 10 includes four layers: a bottom layer 16 of polysilicon (POLY-1), a layer of tungsten silicide (WSi) 18, an interpoly oxide (IPO) layer 20 and a top layer 22 of polysilicon (POLY-2). (WSi being a binary metallic conductor, WSi layer 18 serves to improve the electrical conductivity of POLY-1 layer 16. Note that although the stoichiometry of the chemical compound tungsten silicide actually is $WSi_2$, tungsten silicide is commonly referred to in the art as "WSi". In practice, the stoichiometry of layer 18 deviates from the strict 1:2 stoichiometric ratio of tungsten to silicon.) Polysilicon layer 16 and WSi layer 18 together constitute the lower plate of capacitor 10. Interpoly oxide layer 20 constitutes the dielectric of capacitor 10. Polysilicon layer 22 constitutes the upper plate of capacitor 10.

Conventionally, capacitor 10 is fabricated as follows. polysilicon layer 16 is deposited by chemical vapor deposition of silane. WSi layer 18 is deposited on polysilicon layer 16 by chemical vapor deposition of tungsten hexafluoride and silane. Interpoly oxide layer 20 is deposited on WSi layer 18 by chemical vapor deposition of tetraethoxysilane (TEOS), followed by heating in a mixture of oxygen and nitrogen gases. Polysilicon layer 22 is deposited on interpoly oxide layer 20 using chemical vapor deposition of silane. Finally, capacitor 10 is heated again in ambient air to anneal WSi layer 18. This final heating in an oxidizing atmosphere produces, as a byproduct, an oxide layer 24 that covers capacitor 10.

SUMMARY OF THE INVENTION

According to the present invention there is provided a process for fabricating a capacitor, including the steps of: (a) depositing a first polycrystalline semiconductor layer; (b) depositing a layer of a binary metallic conductor on the first polycrystalline semiconductor layer; (c) annealing the layer of the binary metallic conductor in an oxidizing atmosphere, thereby at least partially oxidizing the layer of the binary metallic conductor; and (d) depositing a second polycrystalline semiconductor layer on the at least partly oxidized layer of the binary metallic conductor, subsequent to the annealing.

According to the present invention there is provided a process for fabricating a component of a microcircuit, including the steps of: (a) depositing a polycrystalline semiconductor layer; (b) depositing a layer of a binary metallic conductor on the polycrystalline semiconductor layer; and (c) annealing the layer of the binary metallic conductor in an oxidizing atmosphere, thereby at least partially oxidizing the layer of the binary metallic conductor, prior to any deposition of any other material on the layer of the binary metallic conductor.

According to the present invention there is provided a capacitor including: (a) a lower plate; (b) an upper plate; and (c) between the lower and upper plates, a dielectric having a refractive index, at a wavelength of 628 nm, of at most about 1.44.

According to the present invention there is provided a capacitor including: (a) a lower plate; (b) an upper plate; and (c) between the lower and upper plates, a dielectric having a charge to breakdown of at least about 10 coulombs/$cm^2$.

According to the present invention there is provided a capacitor including: (a) a lower plate; (b) an upper plate; and (c) between the lower and upper plates, a dielectric having a breakdown voltage of at least about 29 volts.

The concept of the present invention is to anneal WSi layer 18 in an oxidizing atmosphere immediately after the deposition of WSi layer 18 on polysilicon layer 16. Polysilicon layer 22 then is deposited directly on the oxide layer thus formed on WSi layer 18. That oxide layer then serves as the dielectric of capacitor 10, in place of interpoly oxide layer 20 that formerly was deposited by chemical vapor deposition.

The physical properties of the WSi oxide layer of the present invention are superior to those of prior art interpoly oxide layer 20. Specifically, the WSi oxide layer has an index of refraction, at a wavelength of 628 nm, of at most about 1.44, a charge to breakdown of at least about 10 coulombs/$cm^2$ and a breakdown voltage of at least about 29 volts. The scope of the present invention includes a capacitor that uses the WSi oxide layer of the present invention as its dielectric. The Figure, in addition to illustrating a prior art capacitor, also serves to illustrate a capacitor of the present invention, it being understood that reference numeral 20 then refers to the WSi oxide layer of the present invention.

Although the invention is described herein in terms of a capacitor whose conductive plates are made of polysilicon and tungsten silicide, with the dielectric of the capacitor being oxidized tungsten silicide, the scope of the invention includes the fabrication of capacitors from any polycrystalline semiconductor, not just polysilicon, and of any binary metallic conductor, not just tungsten silicide.

BRIEF DESCRIPTION OF THE DRAWINGS

The invention is herein described, by way of example only, with reference to the accompanying drawings, wherein:

The sole FIGURE is a schematic cross section of a capacitor in a microcircuit.

DESCRIPTION OF THE PREFERRED EMBODIMENTS

The present invention is of a process for fabricating capacitors in microcircuits.

The principles and operation of capacitor fabrication according to the present invention may be better understood with reference to the drawing and the accompanying description.

The following are the steps of a typical prior art process for fabricating capacitor 10.

1A. Poly Deposition

Polysilicon layer 16, 1500 Å thick, is deposited by low pressure chemical vapor deposition (LPCVD) of silane at a temperature of 625° C. and at a pressure of 250 mtorr.

1B. Backside Strip

The 1500 Å layer of polysilicon and the 200 Å layer of silicon dioxide formed on the back side of wafer 14 by step 1A are removed by wet etching.

1C. $POCl_3$ Doping

Polysilicon layer 16 is doped with $POCl_3$ at a temperature of 820° C. Along with wafer 14, a bare silicon control wafer also is doped, and the doping continues until the surface resistivity of the control wafer is 41 ohm/cm$^2$. This doping is followed by annealing under ambient air at a temperature of 850° C.

1D. Deglaze

The oxide layer formed as a byproduct of step 1C is removed by wet stripping.

1E. HF last

Dilute hydrofluoric acid is applied to the exposed upper surface of polysilicon layer 16 to render that surface hydrophobic.

1F. WSi Deposition

WSi layer 18 is deposited by plasma enhanced chemical vapor deposition (PECVD) of tungsten hexafluoride and silane at a temperature of 370° C. and at a pressure of 600 mtorr.

1G. Poly Mask and Poly Etch

At this point in the fabrication of the circuit that includes capacitor 10, polysilicon layer 16 and WSi layer 18 cover the entire upper surface of wafer 14. An appropriate photoresist mask is applied to WSi layer 18, and the exposed portions of polysilicon layer 16 and WSi layer 18 are removed by a dry plasma etch, using helium, sulfur hexafluoride and hydrogen bromide, at a temperature of 55° C. and at a pressure of 350 mtorr.

2A. IPO Deposition

TEOS is deposited on WSi layer 18 by LPCVD at a temperature of 650° C. and at a pressure of 350 mtorr.

2B. IPO Densification

The TEOS deposited in step 2A is converted to silicon dioxide by dry oxidation at a temperature of 800° C. in a mixture of nitrogen and oxygen gases, at a ratio of at least 10 volumes of nitrogen to one volume of oxygen, thereby forming interpoly oxide layer 20.

3A. Poly Deposition

Polysilicon layer 22, 2700 Å thick, is deposited by LPCVD of silane at a temperature of 625° C. and at a pressure of 250 mtorr.

3B. POCl$_3$ Doping

Polysilicon layer 22 is doped with POCl$_3$ at a temperature of 820° C. Along with wafer 14, a silicon control wafer covered with polysilicon also is doped, until the surface resistivity of the control wafer is 25 ohm/cm$^2$. This doping is followed by annealing under a mixture of 4 parts nitrogen gas to one part oxygen gas at a total pressure of one atmosphere and at a temperature of 875° C.

3C. Deglaze

The oxide layer formed as a byproduct of step 3B is removed by wet stripping.

3D. Poly Mask and Poly Etch

At this point in the fabrication of the circuit that includes capacitor 10, polysilicon layer 22 covers the entire upper surface of wafer 14. An appropriate photoresist mask is applied to polysilicon layer 22, and the exposed portion of polysilicon layer 22 is removed by a dry plasma etch, using helium, sulfur hexafluoride and hydrogen bromide, at a temperature of 55° C. and at a pressure of 350 mtorr.

3E. IPO Etch

Step 3D removes the unwanted portion of polysilicon layer 22, thereby revealing interpoly oxide layer 20, which, at this point, covers the entire upper surface of wafer 14, not just the portions of polysilicon layer 16 and WSi layer 18 that were left behind by step 1G. With the mask from step 3D still in place, the exposed portion of interpoly oxide layer 20 is removed by wet etching.

3F. WSi anneal

WSi layer 18 is annealed at a temperature of 900° C. in a 10:1 (by volume) mixture of nitrogen and oxygen gases.

According to the present invention, steps 2A, 2B and 3E are omitted, and step 3F is performed between steps 1G and 3A instead of at the end of the process. Because step 3F is conducted in an oxidizing environment, this step, in addition to annealing WSi layer 18, also partly oxidizes WSi layer 18, producing the functional equivalent of interpoly oxide layer 20 to serve as the dielectric of capacitor 10. In addition to saving the time and expense associated with the omitted steps, the process of the present invention yields a superior product. For example, capacitor 10 may be included in the analog side of a circuit, such as an A/D converter, that also includes a digital side that lacks capacitors. Steps 2A, 2B and 3E (especially step 3E) invariably have unwanted side effects on the digital side of the circuit. Omitting these steps precludes these unwanted side effects.

The physical properties of the WSi oxide layer are superior to those of interpoly oxide layer 20. The WSi oxide layer has a lower index of refraction, at a wavelength of 628 nm, of 1.44, as opposed to 1.45 for interpoly oxide layer 20. The WSi oxide layer has a significantly higher charge to breakdown, about 10 coulombs/cm$^2$, as opposed to the 2 to 3 coulombs/cm$^2$ charge to breakdown of interpoly oxide layer 20. The WSi oxide layer has a higher breakdown voltage, about 29 volts, as opposed to the 26 volt breakdown voltage of interpoly oxide layer 20.

Although the most preferred temperature for the WSi anneal is 900° C., this step may be carried out at any temperature between about 800° C. and 1000° C. Near the optimum anneal temperature of 900° C. and the optimum volume ratio of nitrogen to oxygen of 10:1, a 1° C. increase in the anneal temperature increases the thickness of the WSi oxide layer by about 2.5 Å.

The preferred thickness of the WSi oxide layer created in this manner is about 250 Å. The thickness of this oxide layer is monitored by ellipsometric monitoring of the thickness of a silicon dioxide layer grown simultaneously on a bare silicon wafer. It has been found that when the thickness of the oxide layer on the bare silicon wafer reaches about 42 Å under process conditions, the thickness of the WSi oxide layer is the desired ~250 Å. At the optimum anneal temperature of 900° C. and the optimum volume ratio of nitrogen to oxygen of 10:1, the rate of growth of the WSi oxide layer is about 25 Å every 3 minutes.

While the invention has been described with respect to a limited number of embodiments, it will be appreciated that many variations, modifications and other applications of the invention may be made.

What is claimed is:

1. A process for fabricating a capacitor, comprising the steps of:
   (a) depositing a first polycrystalline semiconductor layer on a substrate;
   (b) depositing a layer of a binary metallic conductor on said first polycrystalline semiconductor layer;
   (c) annealing said layer of said binary metallic conductor in an oxidizing atmosphere, thereby at least partially oxidizing said layer of said binary metallic conductor; and
   (d) depositing a second polycrystalline semiconductor layer on said at least partly oxidized layer of said binary metallic conductor, subsequent to said annealing.

2. The process of claim 1, wherein said polycrystalline semiconductor layers include polysilicon.

3. The process of claim 2, wherein said polysilicon is deposited by low pressure chemical vapor deposition.

4. The process of claim 1, wherein said binary metallic conductor includes tungsten silicide.

5. The process of claim 4, wherein said tungsten silicide is deposited by pressure enhanced chemical vapor deposition of tungsten fluoride and silane.

6. The process of claim 1, wherein said annealing is effected under a mixture of nitrogen and oxygen gases.

7. The process of claim 1, wherein said annealing is effected at a temperature of between about 800° C. and about 1000° C.

8. A process for fabricating a component of a microcircuit, comprising the steps of:
   (a) depositing a polycrystalline semiconductor layer on a substrate;
   (b) depositing a layer of a binary metallic conductor on said polycrystalline semiconductor layer; and
   (c) annealing said layer of said binary metallic conductor in an oxidizing atmosphere, thereby at least partially oxidizing said layer of said binary metallic conductor, prior to any deposition of any other material on said layer of said binary metallic conductor.

9. A capacitor comprising:
   (a) a lower plate;
   (b) an upper plate; and
   (c) between said lower and upper plates, a dielectric having a refractive index, at a wavelength of 628 nm, of at most about 1.44.

10. The capacitor of claim 9, wherein said upper plate includes a polycrystalline semiconductor, said lower plate includes both said polycrystalline semiconductor and a binary metallic conductor, and said dielectric includes an oxide of said binary metallic conductor.

11. A capacitor comprising:
   (a) a lower plate;
   (b) an upper plate; and
   (c) between said lower and upper plates, a dielectric having a thickness of about 250 Å and a charge to breakdown of at least about 10 coulombs/cm$^2$.

12. The capacitor of claim 11, wherein said upper plate includes a polycrystalline semiconductor, said lower plate includes both said polycrystalline semiconductor and a binary metallic conductor, and said dielectric includes an oxide of said binary metallic conductor.

13. A capacitor comprising:
   (a) a lower plate;
   (b) an upper plate; and
   (c) between said lower and upper plates, a dielectric having a thickness of about 250 Å and a breakdown voltage of at least about 29 volts.

14. The capacitor of claim 13, wherein said upper plate includes a polycrystalline semiconductor, said lower plate includes both said polycrystalline semiconductor and a binary metallic conductor, and said dielectric includes an oxide of said binary metallic conductor.

* * * * *

UNITED STATES PATENT AND TRADEMARK OFFICE
CERTIFICATE OF CORRECTION

PATENT NO. : 6,340,620 B1
DATED : January 22, 2002
INVENTOR(S) : Korobov et al.

It is certified that error appears in the above-identified patent and that said Letters Patent is hereby corrected as shown below:

Title page,
Item [75], the inventors name is incorrect, it should show -- Rackman --

Signed and Sealed this

Twenty-eighth Day of May, 2002

*Attest:*

*Attesting Officer*

JAMES E. ROGAN
*Director of the United States Patent and Trademark Office*